United States Patent
Ker et al.

(10) Patent No.: US 6,867,461 B1
(45) Date of Patent: Mar. 15, 2005

(54) ESD PROTECTION CIRCUIT

(75) Inventors: Ming-Dou Ker, Hsinchu (TW);
Kun-Hsien Lin, Pingtung (TW)

(73) Assignee: National Chiao Tung University,
Hsinchu (TW)

( * ) Notice: Subject to any disclaimer, the term of this patent is extended or adjusted under 35 U.S.C. 154(b) by 0 days.

(21) Appl. No.: 10/814,128

(22) Filed: Apr. 1, 2004

(30) Foreign Application Priority Data

Feb. 10, 2004   (TW) ........................................ 93103024 A

(51) Int. Cl.[7] ............................................. H01L 23/62
(52) U.S. Cl. ........................ 257/360; 257/361; 257/363
(58) Field of Search ................................. 257/357, 358, 257/359, 360, 361, 363

(56) References Cited

U.S. PATENT DOCUMENTS

| | | | | |
|---|---|---|---|---|
| 5,229,635 A | | 7/1993 | Bessolo et al. | |
| 5,287,241 A | * | 2/1994 | Puar | 257/357 |
| 6,770,938 B1 | * | 8/2004 | Fliesler et al. | 257/358 |
| 6,774,438 B2 | * | 8/2004 | Arai et al. | 257/358 |
| 2001/0033003 A1 | * | 10/2001 | Sawahata | 257/355 |

* cited by examiner

*Primary Examiner*—Ngân V. Ngô
(74) *Attorney, Agent, or Firm*—Rosenberg, Klein & Lee

(57) ABSTRACT

The claimed invention discloses an ESD protection circuit that is applied to an IC with power-down-mode operation. When the IC goes into power-down-mode operation, leakage current and charging from the I/O pad to the VDD power line could be prevented by applying the present invention. Therefore, the malfunction of the IC can be avoided. There still have two ESD clamp circuits respectively connected between the VDD power line and the VSS power line and between ESD bus line and VSS power line, so as to achieve the whole chip ESD protection scheme. The present invention can prevent ESD protection circuit from resulting in leakage current or malfunction under power-down-mode operation, and moreover achieve whole chip ESD protection scheme.

13 Claims, 13 Drawing Sheets

US 6,867,461 B1

ESD PROTECTION CIRCUIT

BACKGROUND OF INVENTION

1. Field of the Invention

The present invention relates to an electrostatic discharge protection (ESD) circuit, and more particularly, to an ESD protection circuit applied to an IC with power-down-mode operation.

2. Description of the Prior Art

For power consumption consideration, an IC with power-down-mode operation becomes more and more attractive especially in the SOC (System on a Chip) design for the portable and mobile devices. FIG. 1 shows an example of two chips connected in a system 10, wherein a first chip 12 is biased by the VDD1 power line 14 and a second chip 16 is biased by the VDD2 power line 18. Besides, the output pad 20 of the first chip 12 is connected to the input pad 22 of the second chip 16. When the second chip 16 goes into the power-down-mode operation and the output voltage level of the first chip 12 is high, two situations are explained as follows. First, if VDD2 power line 18 is grounded, large leakage current may be induced from the output pad 20 to the VDD2 power line 18 through the input pad 22 and the parasitic diode 24 of PMOS that is connected between the input pad 22 and VDD2 power line 18. Second, if the VDD2 power line 18 is floating, the high level voltage of the output pad 20 will charge the VDD2 power line 18 through the input pad 22 and the parasitic diode 24 of PMOS, and then the internal circuit 26 of the second chip 16 may be triggered and results in malfunction. Therefore, the parasitic diode 24 of PMOS connected between the input pad and VDD2 power line need to be removed to avoid the problems described above.

To avoid unexpected ESD damage in the integrated circuits, the ESD design is needed for most ICs. FIG. 2 is a scheme showing the traditional ESD protection circuit. According to FIG. 2, when the ESD protection circuit is under the positive-to-VSS ESD mode, the VSS power line 34 is grounded. Then the positive electrostatic charge at the I/O pad 30, 32 can be discharged through the parasitic diode 36 of PMOS, the VDD power line 38 and the power-rail ESD clamp circuit 40 to the VSS power line 34. When the ESD protection circuit is under the positive-to-VDD ESD mode, the VDD power line 38 is grounded and the positive electrostatic charge at the I/O pad 30, 32 can be discharged through the parasitic diode 36 of PMOS to VDD power line 38. In addition, when the ESD protection circuits are under the negative-to-VSS ESD mode, the VSS power line 34 is grounded and then the negative electrostatic charge at the I/O pad 30, 32 can be discharged through the parasitic diode 42 of NMOS to VSS power line 34. Furthermore, when the ESD protection circuits are under the negative-to-VDD ESD mode, the VSS power line 34 is grounded and thus the negative electrostatic charge at the I/O pad 30, 32 can be discharged through the parasitic diode 42 of NMOS, VSS power line 34, and power-rail ESD clamp circuit 40 to the VDD power line 38.

According to the description in the first paragraph, the parasitic diode of PMOS must be removed under the power-down-mode operation. However, if the ESD protection circuit stated in the second paragraph applies to the IC with power-down-mode operation, the electrostatic charge at the I/O pad under positive-to-VSS mode can't be discharged through the parasitic of the PMOS, the VDD power line, and the power-rail ESD clamp circuit to VSS power line. Hence, the positive-to-VSS voltage on the I/O pad is discharged to the VSS power line merely by the snapback breakdown of the GGNMOS (Gate-Grounded NMOS). Due to the junction breakdown voltage is close to the oxide breakdown voltage as the device shrinks, the GGNMOS could not provide efficient ESD protection. At the same time, the non-uniform turn-on issue often lowers the ESD level of the GGNMOS and the positive-to-VDD ESD voltage zapping on the I/O pad cannot be discharged from the I/O pad to VDD power line without causing the PMOS breakdown. Therefore, such positive-to-VDD ESD voltage on the I/O pad will also be discharged through the GGNMOS by snapback breakdown to the VSS line, and then through the power-rail ESD clamp circuit to the grounded VDD power line. For the reasons stated above, the disappearance of the parasitic diode of PMOS may severely degrade the ESD performance.

In order to solve the above problems, someone replaces the parasitic diode of the PMOS with GGNMOS as disclosed in USA patent "ESD protection circuit and method for power-down application" (U.S. Pat. No. 5,229,635). However, the GGNMOS that discharges electrostatic charge with snapback breakdown will turn on irregularly and result in a poor ESD protection effect. Besides, someone teaches the design for improving the ESD robustness of the ESD protection circuit connected between the I/O pad and VSS power line as reported in "Tech. Dig. Of IEDM, 2002, pp. 349-352". According to this design, all electrostatic charge discharges via the ESD protection circuit connected between the I/O pad and the VSS power line. However, this ESD protection circuit is too complicated and the consumption for ESD protection is much higher.

SUMMARY OF INVENTION

It is therefore an objective of the claimed invention to provide an ESD protection circuit, which can apply to an IC with power-down-mode operation so as to avoid the unexpected leakage current or charge inducing from the I/O pad to the VDD power line, and consequently to prevent the undesired malfunction.

It is therefore another objective of the claimed invention to provide an ESD protection circuit comprising ESD clamp circuits separately connected between ESD bus line and VSS power line and between VDD power line and VSS power line, so as to achieve the whole chip ESD protection design.

According to the claimed invention, an ESD protection circuit comprises an input circuit and an output circuit. The input circuit connects with an ESD bus line, a VDD power line, and a VSS power line, respectively. The output circuit connects with the VDD power line and the VSS power line and has a third diode forward connected between the output pad and the ESD bus line. Meanwhile, there is a first ESD clamp circuit connected between the ESD bus line and the VSS power line, and a second ESD clamp circuit connected between the VDD power line and the VSS power line. Therefore, electrostatic charge at the input pad may be discharged through the ESD bus line and the first ESD clamp circuit to VSS power line, or through the ESD bus line, the first ESD clamp circuit, the VSS power line, and the second ESD clamp circuit to the VDD power line. Similarly, electrostatic charge at the output pad can be discharged through the third diode and then through the same discharging path of the input pad. Thus, a whole chip ESD protection scheme can be obtained. In addition to the devices described above, there is a first diode forward connected between the VDD power line and the ESD bus line, so as to prevent the unexpected leakage current and charge from the input pad to the VDD power line under the power-down-mode operation. At the same time, there is a second diode forward connected between the VDD power line and the output circuit, so as to avoid the unexpected leakage current and charge from the output pad to the VDD power line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
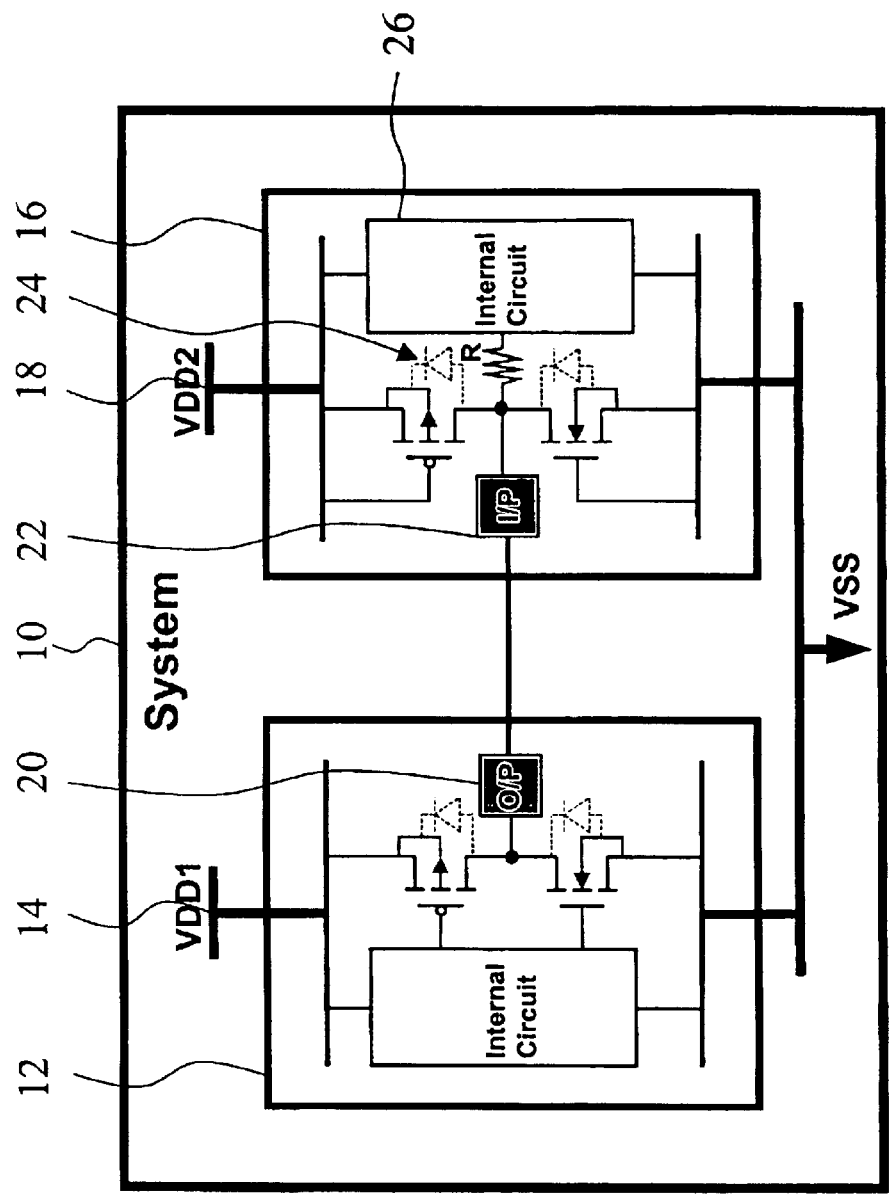
FIG. 1 is a scheme of two chips connected in a system according to the prior art.
Figure 2:
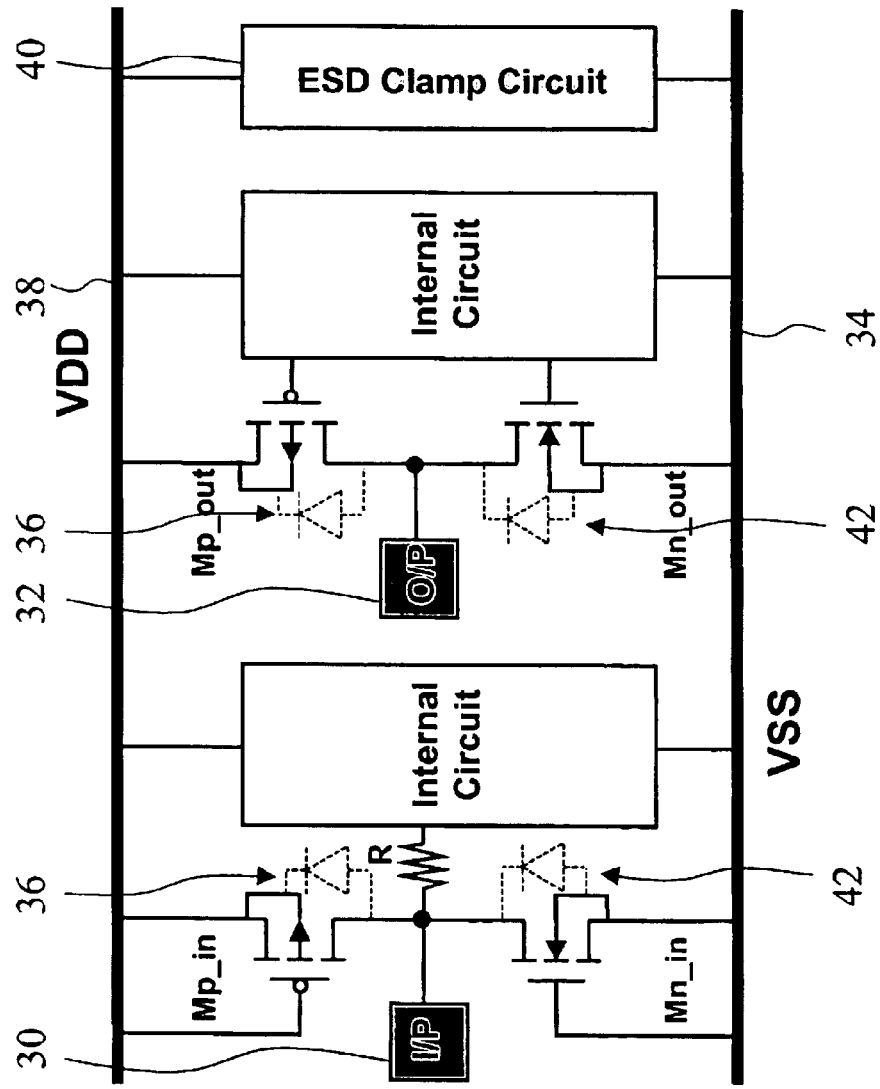
FIG. 2 is a diagram of an ESD protection circuit according to the prior art.

The claimed invention discloses an ESD protection circuit. The well-designed ESD protection circuit utilizes an ESD bus line and diodes to achieve the whole chip ESD protection effect and thus prevent leakage current or malfunction from occurring under the power-down-mode operation. Please refer to FIG. 3, which is a schematic diagram of an embodiment according to present invention. An IC with power-down-mode function comprising an input circuit 50, which comprises an input pad 52 connected to the drain of an input PMOS 54 and the drain of an input NMOS 56. The input pad 52 further connects to a first internal circuit 60 through a resistor 58. Moreover, there has an output circuit 62 comprising an output pad 64 connected separately with the drain of an output PMOS 66 and the drain of the output NMOS 68. Meanwhile, the gates of the output PMOS 66 and the output NMOS 68 are connected to second internal circuit 70. In addition, the ESD protection circuit further comprises a VDD power line 72 and a VSS power line 74. The VDD power line 72 connects and biases the first and second internal circuit 60, 70. At the same time, the VSS power line 74 not only connects and biases the first and second internal circuit 60, 70, but also connects the source and the gate of the input NMOS 56 and the source of the output NMOS 68.

Please refer to FIG. 3 again, in addition to the circuit structure stated above, there still has a floating ESD bus line 76 without additional power source. The ESD bus line 76 connects to the source and the gate of the input PMOS 54. A first ESD clamp circuit 78 connects between the ESD bus line 76 and the VSS power line 74, and a second clamp circuit 80 connects between the VDD power line 72 and the VSS power line 74. Thus, when the input pad 52 is under the positive-to-VSS ESD mode, positive charge will discharge to the VSS power line 74 through the parasitic diode of the input PMOS 54, the ESD bus line 76 and the first ESD clamp circuit 78 in turn as shown in FIG. 4(a). When the input pad 52 is under the positive-to-VDD ESD mode, positive charge will discharge to the VDD power line 72 through the parasitic diode of the input PMOS 54, the ESD bus line 76, the first ESD clamp circuit 78, the VSS power line 74 and the second ESD clamp circuit 80 as shown in FIG. 4(b). When the input pad 52 is under the negative-to-VSS ESD mode or the negative-to-VDD ESD mode, negative charge will discharge through the input NMOS 56 to the VSS power line 74 or through the input NMOS 56, VSS power line 74 and the second ESD clamp circuit 80 to the VDD power line 72. Besides, there is a third diode 86 forward connected between the output pad 64 and the ESD bus line 76. Therefore, when the output pad 64 is under the positive-to-VSS/positive-to-VDD ESD mode, positive charge can discharge through the third diode 86 to the ESD bus line 76 and then discharge via the same discharging path of the input pad 52 under the positive-to-VSS/positive-to-VDD ESD mode as shown in FIG. 4(c)/4(d). Similarly, when the output pad 64 is under the negative-to-VSS ESD mode or the negative-to-VDD ESD mode, negative charge will discharge through the output NMOS 68 to the VSS power line 74 or through the output NMOS 68, VSS power line 74 and the second ESD clamp circuit 80 to the VDD power line 72.

Figure 3:
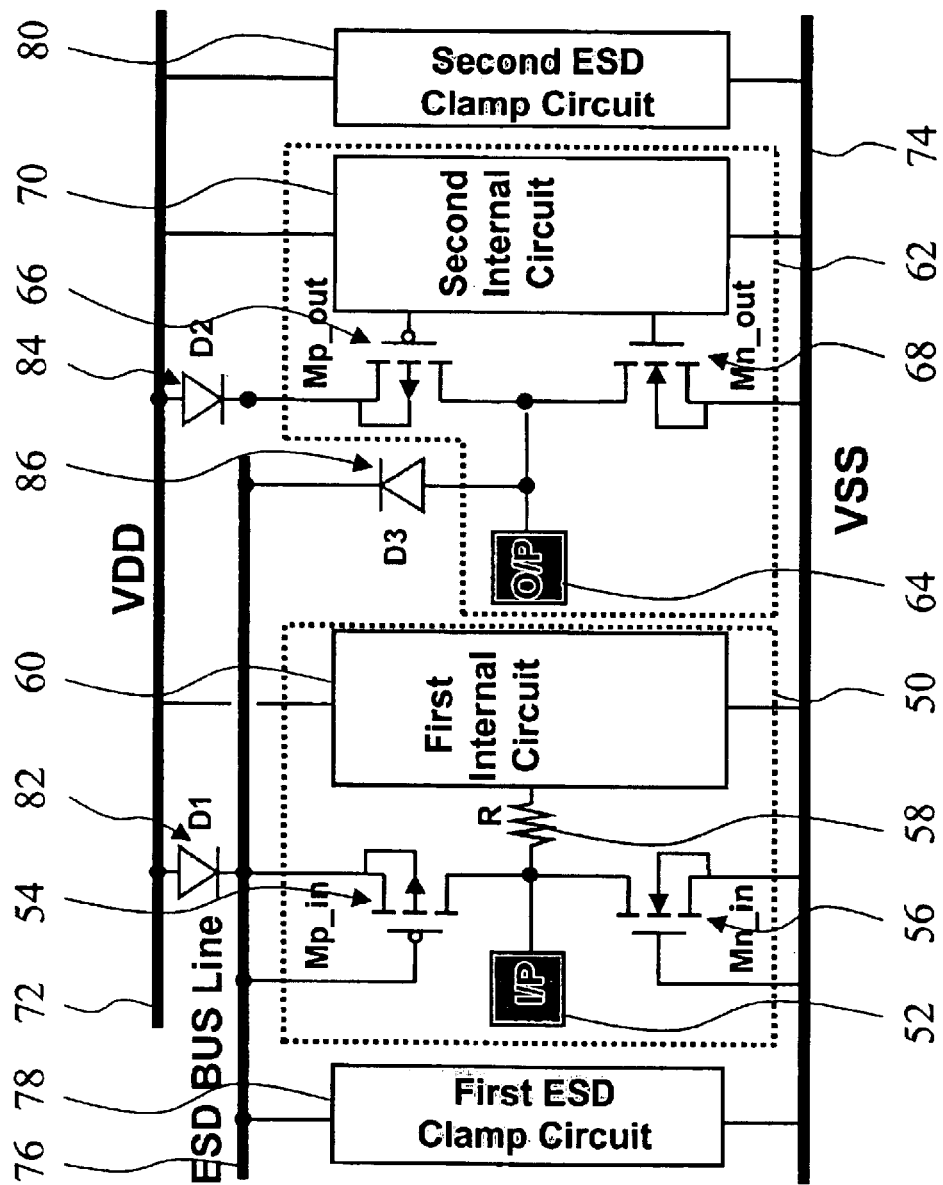
FIG. 3 to FIG. 9 are schematic diagrams of embodiments according to the present invention.
Figure 4A:
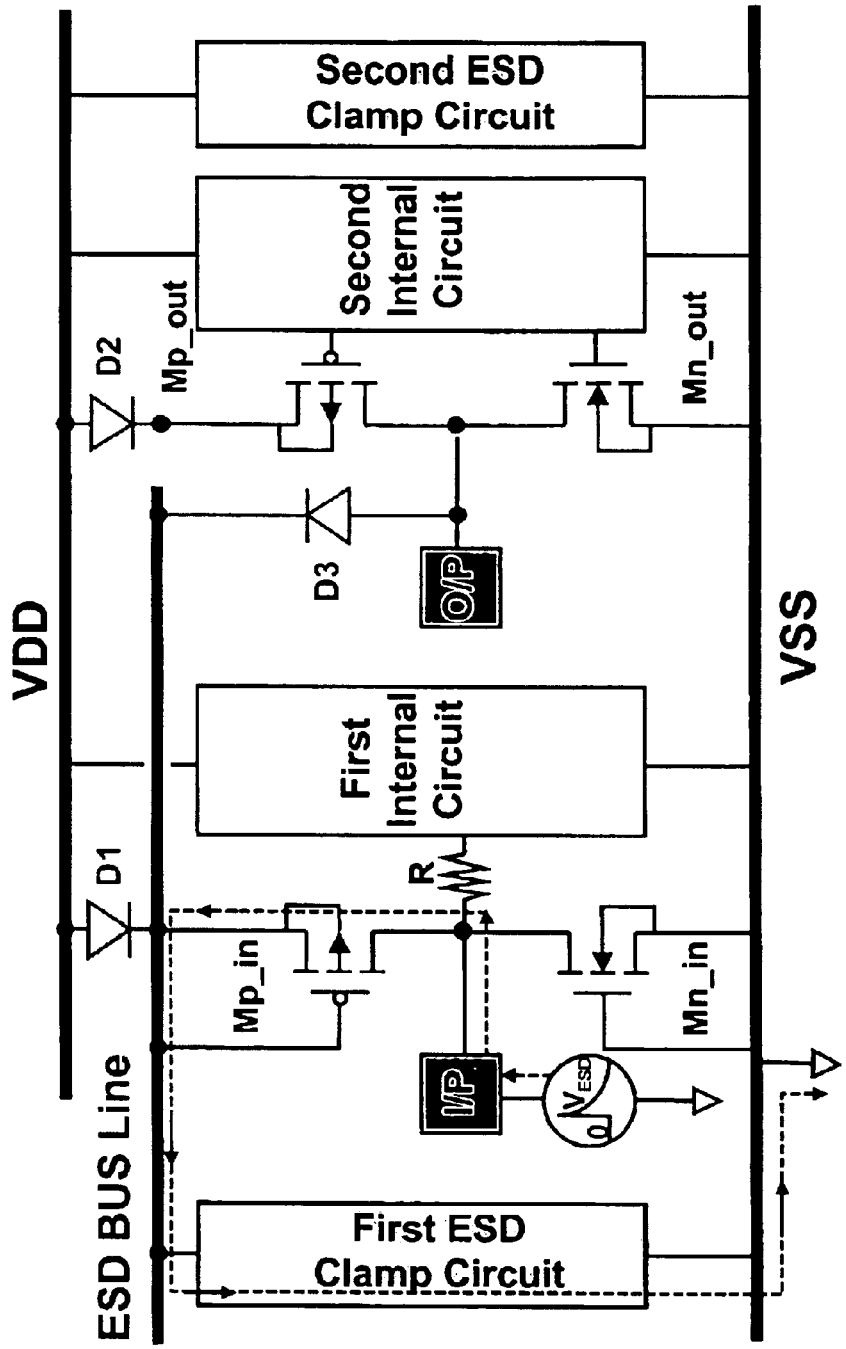
Figure 4B:
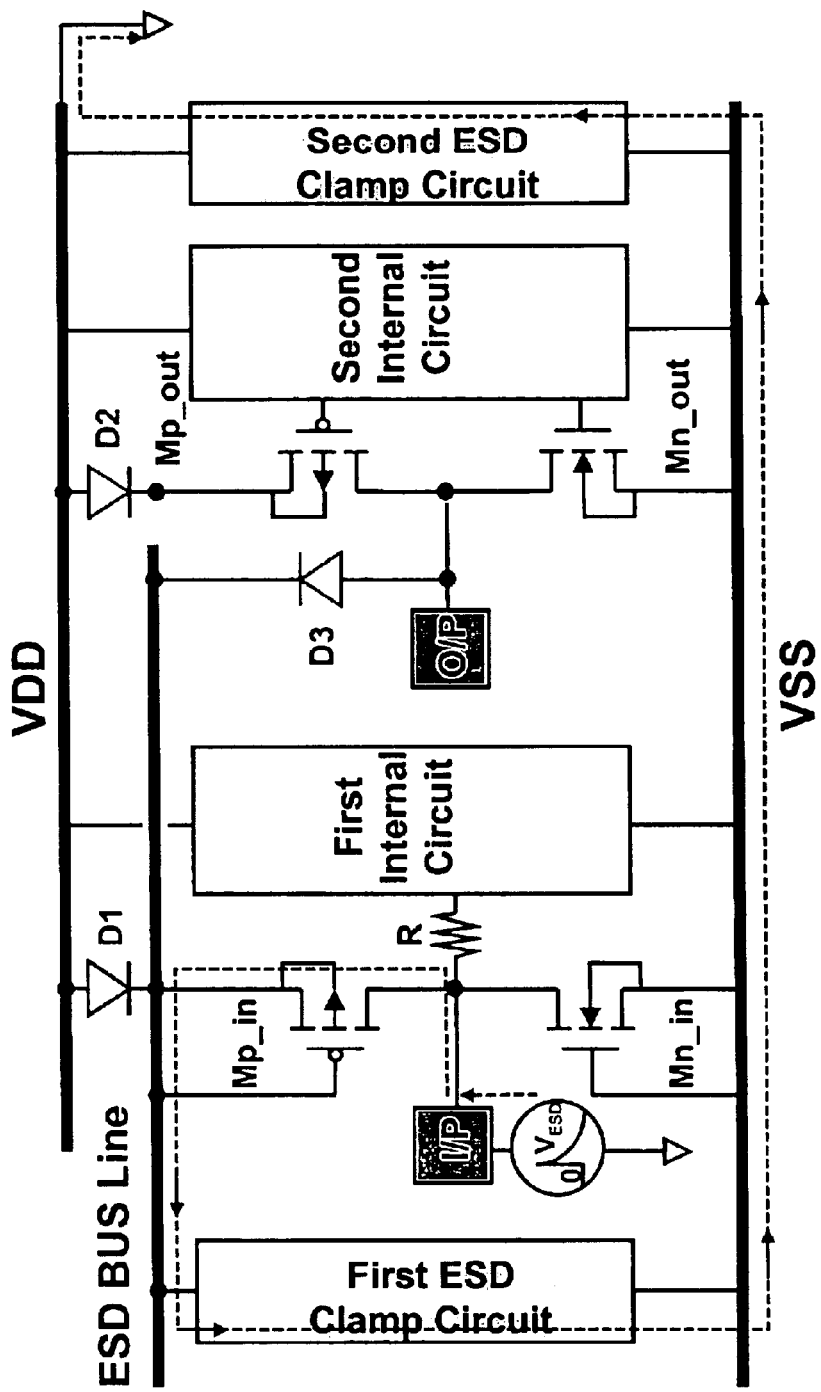
Figure 4C:
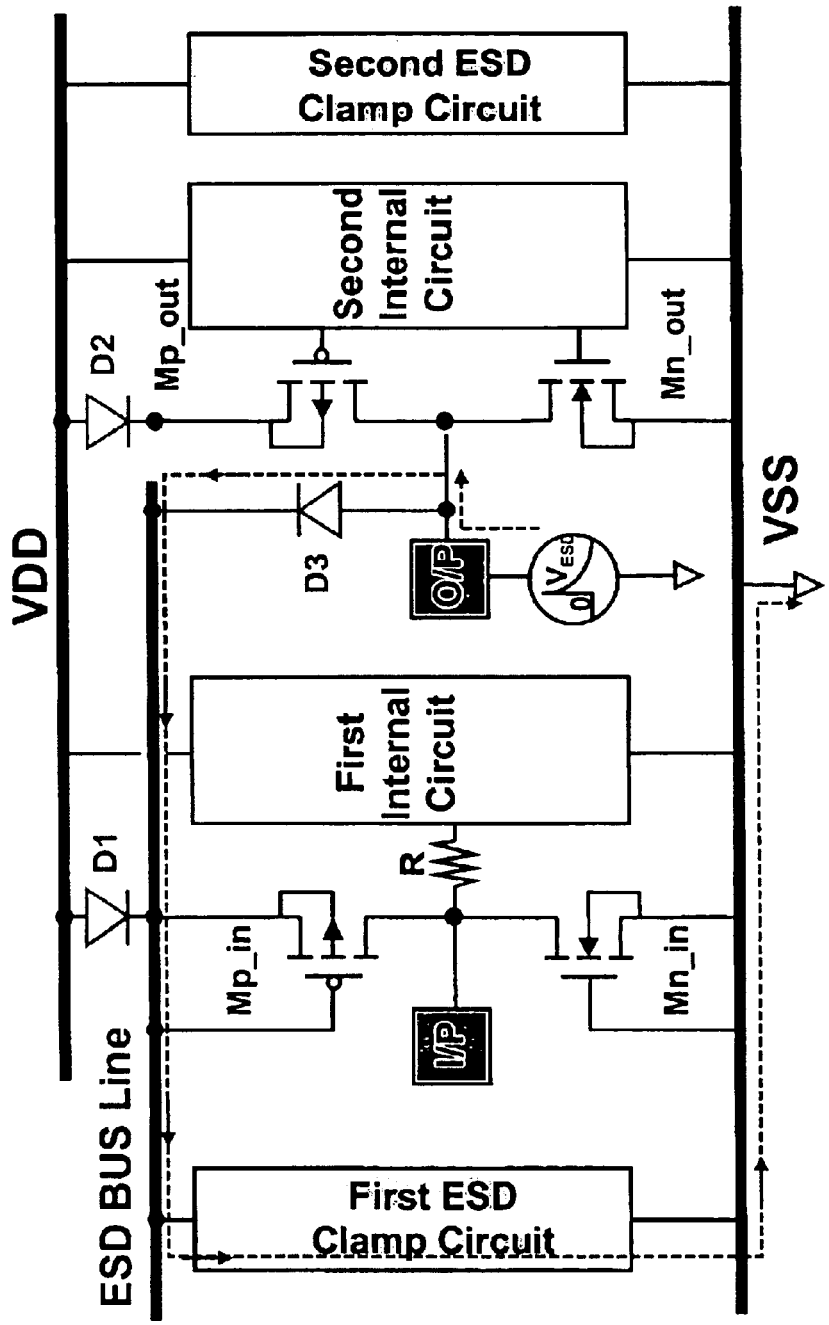
Figure 4D:
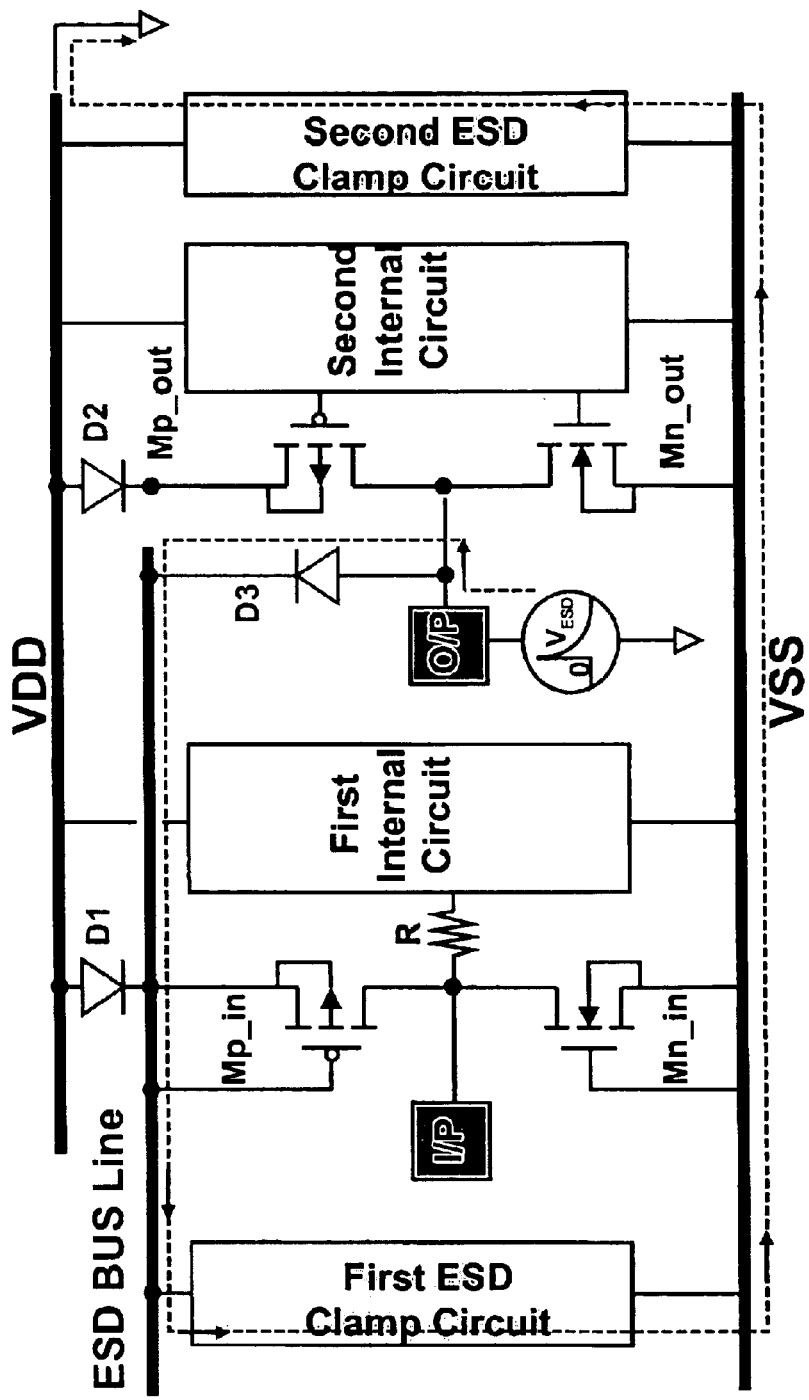

Please refer to FIG. 3 and FIG. 4, to prevent leakage current or the unexpected charge that causing circuit malfunction being induced from the I/O pad 52, 54 with high voltage to the VDD power line under the power-down-mode operation as discussed in the prior art, a first diode 82 is forward connected between the VDD power line 72 and ESD bus line 76 and a second diode 84 is forward connected between the VDD power line 72 and the drain of the output PMOS 66 (i.e. between the VDD power line 72 and the output pad 64). Because of utilizing the two diodes 82, 84, leakage current can be avoided from the I/O pad 52, 64 to the VDD power line 72 when the IC goes into the power-down-mode operation with the grounded VDD power line 72. In addition, when the IC goes into the power-down-mode operation with the floating VDD power line 72, these two diodes 82, 84 can stop the charge from the I/O pad 52, 64 to the VDD power line 72 so as to prevent the malfunction.

Figure 5:
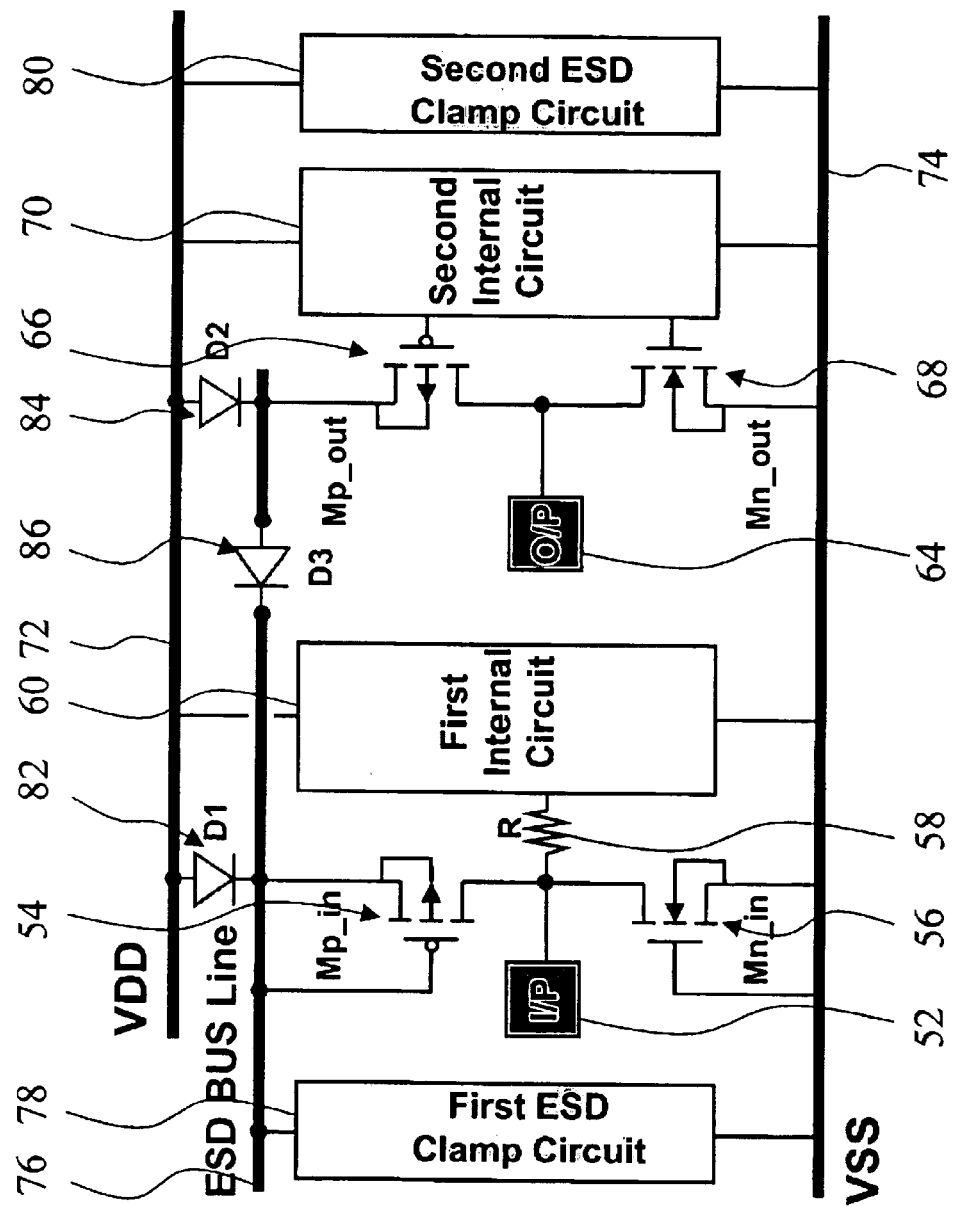

FIG. 5 is another schematic diagram of embodiment according to the present invention. The difference between this embodiment and the previous embodiment is the third diode 86 forward connected between the source of the output PMOS 66 and the ESD bus line 76. Thus, when the output pad 64 is under positive-to-VSS ESD mode, positive charge will discharge to the VSS power line 74 through the parasitic diode of the output PMOS 66, the third diode 86, the ESD bus line 76, and the first ESD clamp circuit 78. When the output pad 64 is under positive-to-VDD ESD mode, positive charge will discharge through the same ESD discharging path of the positive-to-VSS ESD mode and then through the second ESD clamp circuit 80 to the VDD power line 72. The discharging paths of the circuit shown in FIG. 5 under the negative-to-VSS and the negative-to-VDD ESD mode are the same as that of the circuit shown in FIG. 3. Furthermore, both of the circuits shown in FIG. 5 and FIG. 3 could avoid leakage current or undesired charge from I/O pad 52,64 to VDD power line 72 under power-down-mode operation.

Figure 6:
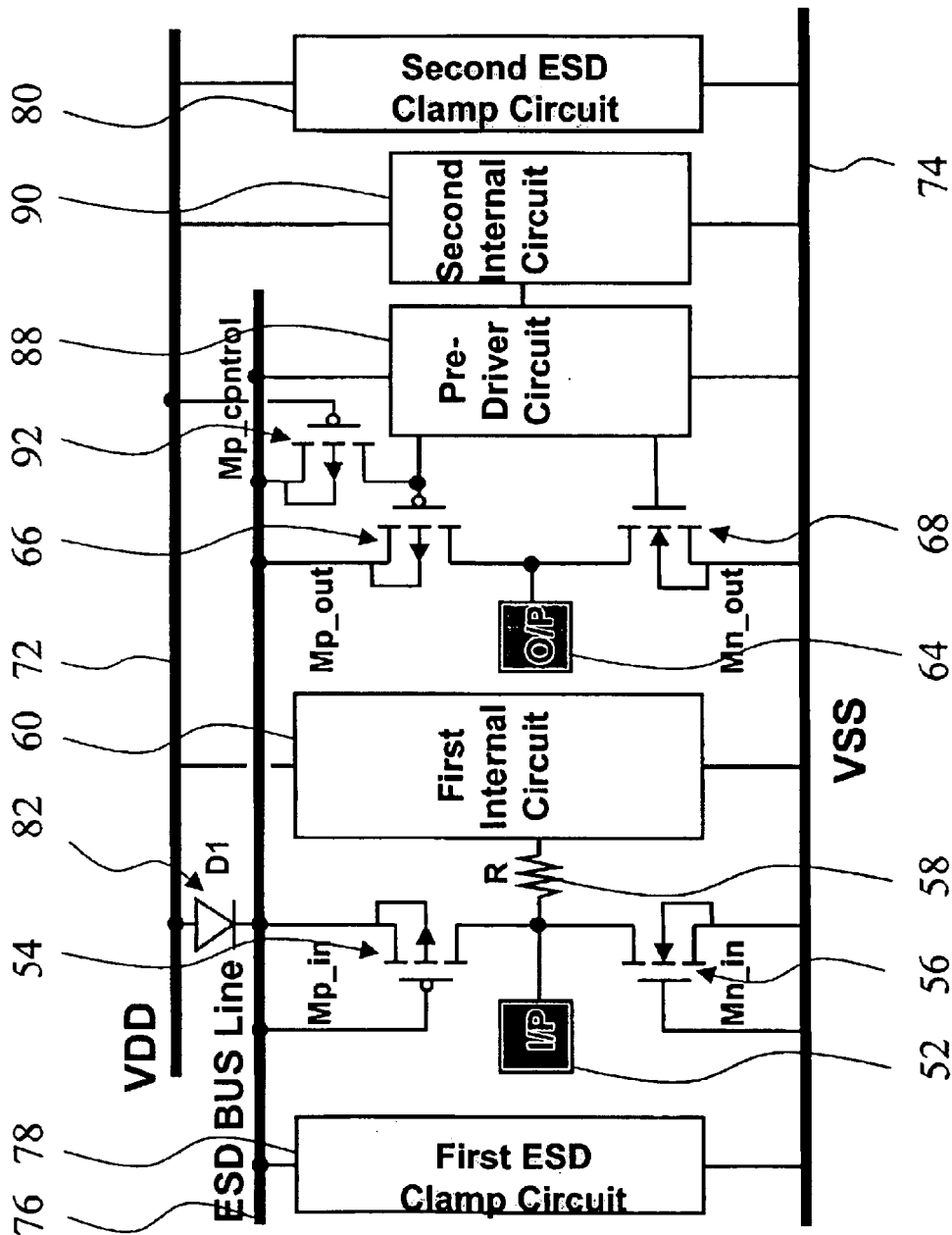

Please refer to FIG. 6, which is another diagram of embodiment according to the claimed invention. The difference between this embodiment and that shown in FIG. 3 comprises the source of the output PMOS 66 connecting to the ESD bus line 76 and the gates of the output PMOS 66 and the output NMOS 68 connecting to a pre-driver circuit 88 which is connected with a second internal circuit 90. There still has a control PMOS 92 with the source connected to the ESD bus line 76 and the drain connected to the gate of the output PMOS 66. At the same time, the gate of the control PMOS 92 is connected to the VDD power line 72 so as to turn off under the normal operation. In other words, the control PMOS 92 turns off when the voltage level of the VDD power line 72 is high. Moreover, the control PMOS 92 will turn on under the power-down-mode operation with the floating or grounded VDD power line 72. After that, the output PMOS 66 turns off so as to avoid leakage current induced by the conducting of the PMOS 66 under the power-down-mode operation. Besides, the pre-deriver circuit 88 is connected to the ESD bus line 76 for getting the power instead of connecting to the VDD power line 72 for receiving the power. Thus, leakage current won't induce from the pre-driver circuit 88 to the VDD power line 72 when the VDD power line is grounded or floating under the power-down-mode operation.

Figure 7:
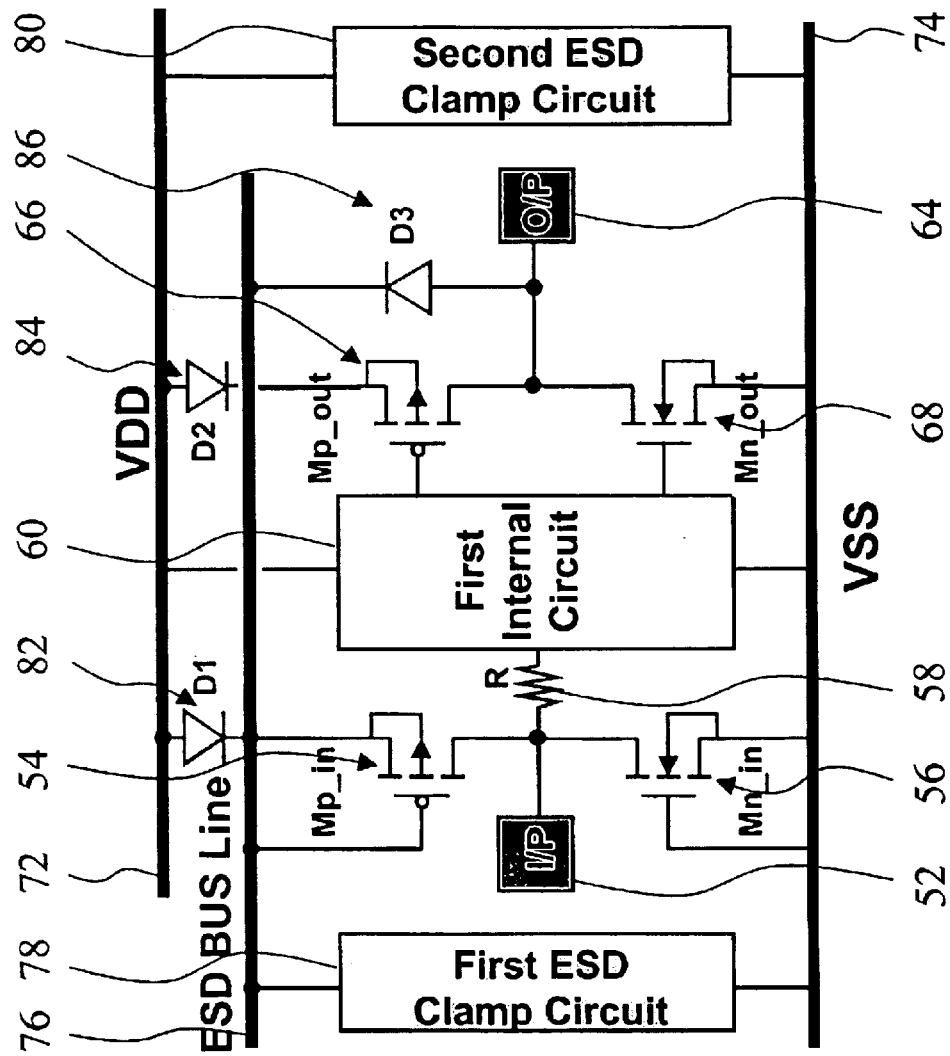
Figure 8:
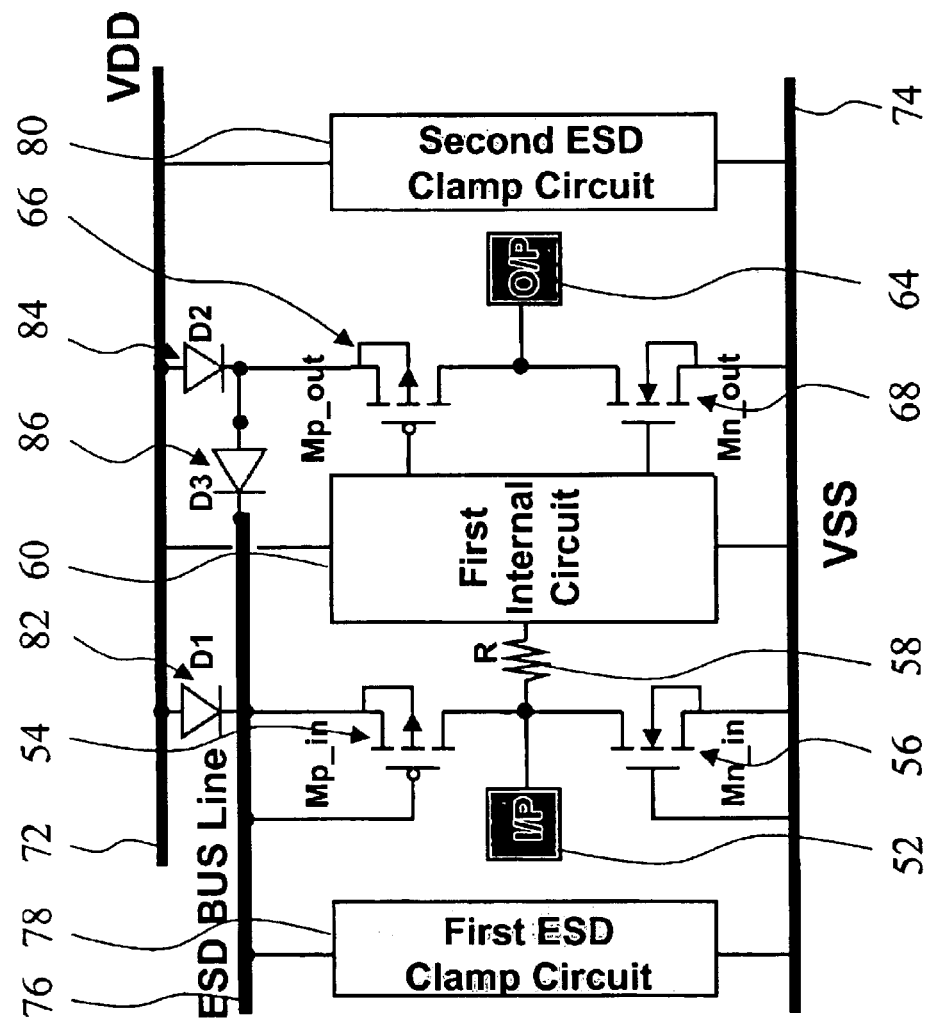
Figure 9:
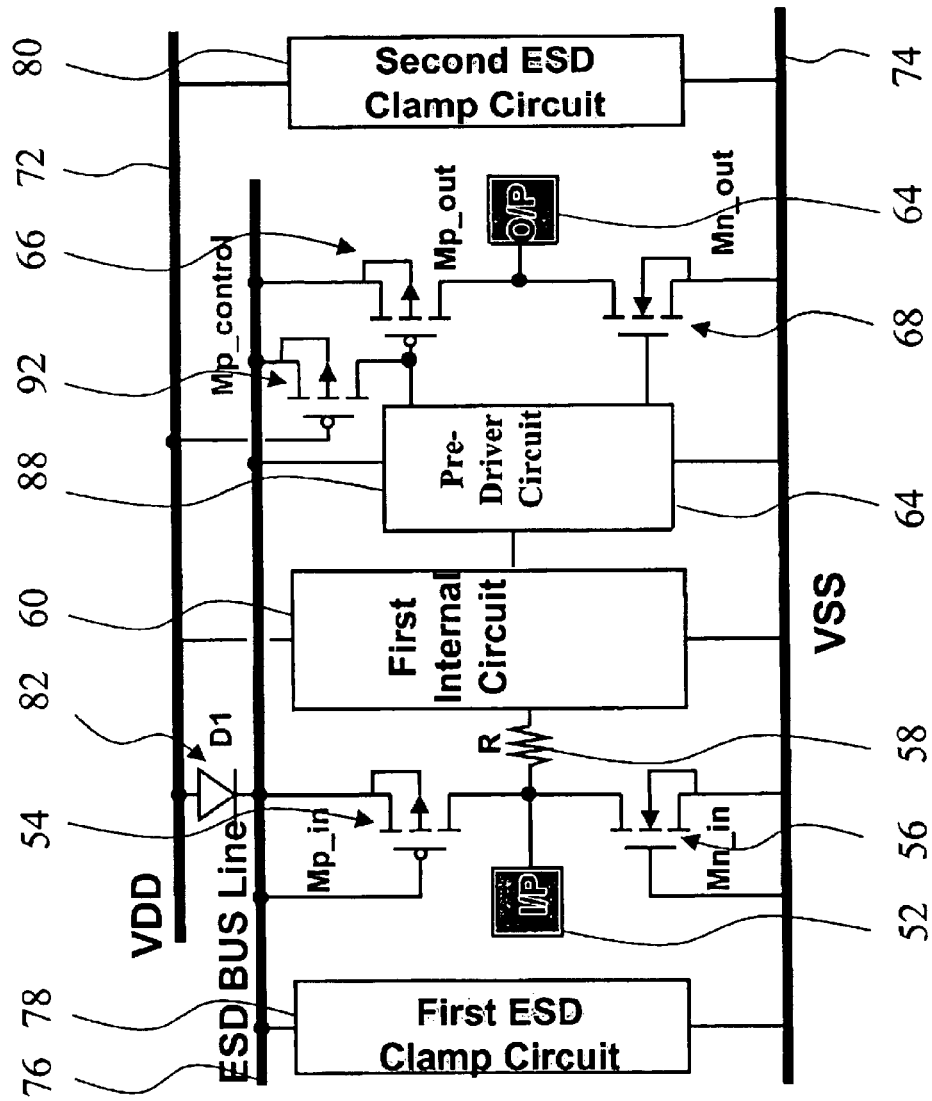

FIG. 7 to FIG. 9 show circuit structures corresponding to that illustrated in FIG. 3, FIG. 5, and FIG. 6, respectively. Compared FIG. 7 with FIG. 3, the second internal circuit 70 shown in FIG. 3 integrates or replaces by the first internal circuit 60 shown in FIG. 7 and the first internal circuit 60 is connected to the gate of the output PMOS 66 and the gate of the output NMOS 68. However, the discharging paths of different kinds of ESD modes and the principles to avoid leakage current and malfunction under power-down-mode operation are the same as the embodiment illustrated in FIG. 3. Similarly, the only difference between the embodiments shown in FIG. 5 and FIG. 8 is the second internal circuit 70 shown in FIG. 5 integrated or replaced by the first internal circuit 60 shown in FIG. 8. As for the ESD protection operation and the method to prevent leakage current or malfunction, these two embodiments are identical. In the same way, the second internal circuit 90 shown in FIG. 6 is integrated or replaced by the first internal circuit 60 shown in FIG. 9. As regards the operation under ESD protection or power-down-mode situation, the two circuits are the same.

Figure 10:
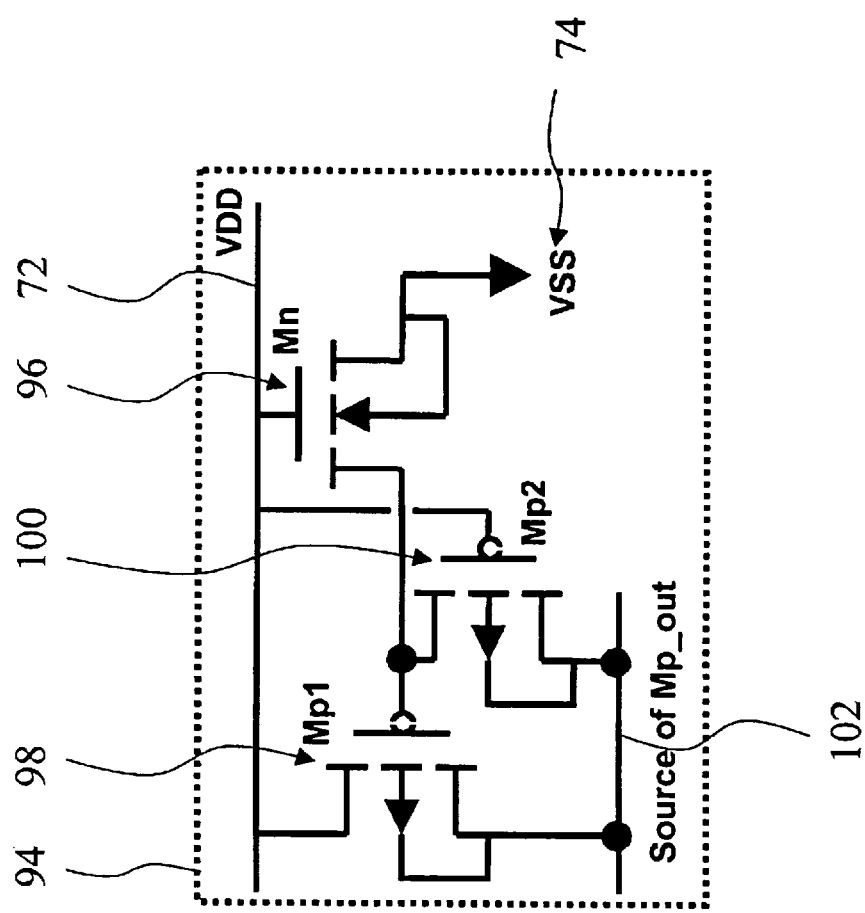
FIG. 10 is the diagram showing the output-swing improvement circuit according to the present invention.

Besides, the first or the second diode will lower the output voltage level at the output pad under normal operation. Therefore, an output swing improvement circuit could be connected between the VDD power line and the source of the output PMOS of each embodiment described above. FIG. 10 illustrates an embodiment with the output swing improvement circuit 94 according to the present invention. As shown in FIG. 10, the output swing improvement circuit 94 comprises a NMOS 96 whose gate and source are connected separately to the VDD power line 72 and the VSS power line 74. The drain of the NMOS 96 connects with the gate of a first PMOS 98 and the source of a second PMOS 100. Meanwhile, the source and drain of the first PMOS 98 are connected to the VDD power line 72 and the source of an output PMOS 102, respectively. The gate and drain of the second PMOS 100 are connected to the VDD power line 72 and the source of a output PMOS 102 in turn. Hence, according to the said circuits relations, the second PMOS 100 turns off and the NMOS 96 turns on when the output voltage of the VDD power line 72 is high. Thus, the gate voltage of the first PMOS 98 equals to the VSS power line 74 and then the channel of the PMOS 98 is induced. After that, the voltage of the VDD power line 72 directly couples to the source of the output PMOS 102 via the first PMOS 98, and the voltage drop induced by the first or the second diode could be avoided.

Although each ESD protection circuit of the embodiments according to the present invention is single stage structure, the ESD protection circuit could be constructed repeatedly with the output pad of the previous stage of the ESD protection circuit connected to the input pad of the next stage of the ESD protection circuit. Hence, a multi-stage ESD protection circuit structure can be obtained.

To sum up the description, the claimed invention utilizes the diodes and the ESD bus line to avoid leakage current or charge from the I/O pad to the VDD power line under the power-down-mode operation. In addition, at least two ESD clamp circuit are separately connected between the ESD bus line and the VSS power line, and between the VDD power line and the VSS power line. So the whole chip ESD protection effect can be expected.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An ESD protection circuit applied to an IC with power-down-mode operation, comprising:
    an input circuit, which comprises:
        an input pad;
        an input PMOS, wherein the drain of said input PMOS is connected to said input pad;
        an input NMOS, wherein the drain of said input NMOS is connected to said input pad; and
        a first internal circuit connected to said input pad through at least one resistor;
    an output circuit, which comprises:
        an output pad;
        an output PMOS, wherein the drain of said output PMOS is connected to said output pad;
        an output NMOS, wherein the drain of said output NMOS is connected to said output pad; and
        a second internal circuit connected to the gate of said PMOS and the gate of said NMOS;
    a VDD power line connected and providing VDD voltage to said first internal circuit and said second internal circuits;
    a VSS power line connected and providing VSS voltage to said first internal circuit and said second internal circuits, said VSS power line still connected to the source and the gate of said input NMOS and the source of said output NMOS;
    an ESD bus line connected to the source and the gate of said input PMOS;
    a first ESD clamp circuit connected between said VSS power line and said ESD bus line;
    a second clamp circuit connected between said VDD power line and said VSS power line;
    a first diode forward connected between said VDD power line and said ESD bus line to avoid leakage current induced from said input pad to said VDD power line, and to avoid positive voltage at said input pad charging to said VDD power line through said input PMOS;
    a second diode forward connected between said VDD power line and the source of said output PMOS to avoid leakage current induced from said output pad to said VDD power line, and to avoid positive voltage at said output pad charging to said VDD power line through said output PMOS; and
    a third diode, wherein the negative terminal of said third diode is connected to said ESD bus line and the coupled node connected to the positive terminal of said third diode is selected from said output pad and the source of said output PMOS.

2. The ESD protection circuit of claim 1, wherein the positive terminal of said third diode is connected to the output pad and then positive charge at said input pad discharges to said VSS power line through said input PMOS, said ESD bus line, and said first ESD clamp circuit under positive-to-VSS ESD mode, and furthermore the positive charge at said output pad discharges to said VSS power line through said third diode, said ESD bus line, and said first ESD clamp circuit under positive-to-VSS ESD mode.

3. The ESD protection circuit of claim 1, wherein the positive terminal of said third diode is connected to the source of said output PMOS and then positive charge at said input pad discharges to said VSS power line through said input PMOS, said ESD bus line, and said first ESD clamp circuit under positive-to-VSS ESD mode, and furthermore the positive charge at said output pad discharges to said VSS power line through said output PMOS, said third diode, said ESD bus line, and said first ESD clamp circuit under positive-to-VSS ESD mode.

4. The ESD protection circuit of claim 1, wherein the positive terminal of said third diode is connected to the output pad and then positive charge at said input pad discharges to said VDD power line through said input PMOS, said ESD bus line, said first ESD clamp circuit, said VSS power line, and said second ESD clamp circuit under positive-to-VDD ESD mode, and furthermore the positive charge at said output pad discharges to said VDD power line through said third diode, said ESD bus line, said first ESD clamp circuit, said VSS power line, and said second clamp circuit under positive-to-VDD ESD mode.

5. The ESD protection circuit of claim 1, wherein the positive terminal of said third diode is connected to the source of said output PMOS and then positive charge at said input pad discharges to said VDD power line through said input PMOS, said ESD bus line, said first ESD clamp circuit, said VSS power line, and said second ESD clamp circuit under positive-to-VDD ESD mode, and furthermore the positive charge at said output pad discharges to said VDD power line through said output PMOS, said third diode, said ESD bus line, said first ESD clamp circuit, said VSS power line, and said second clamp circuit under positive-to-VDD ESD mode.

6. The ESD protection circuit of claim 1, wherein negative charge at said input/output pad discharges to said VSS power line through said input/output NMOS under negative-to-VSS ESD mode.

7. The ESD protection circuit of claim 1, wherein negative charge at said input/output pad discharges to said VDD power line through said input/output NMOS, said VSS power line, and said second ESD clamp circuit under negative-to-VDD ESD mode.

8. The ESD protection circuit of claim 1, which can construct repeatedly to form a multi-stage ESD protection circuit, wherein the output pad of the previous stage of said ESD protection circuits is connected to the input pad of the next stage of said ESD protection circuit.

9. The ESD protection circuit of claim 1 further comprising at least one output swing improvement circuit connected between said VDD power line and the source of said output PMOS for compensating the voltage drop induced by said second diode.

10. The ESD protection circuit of claim 9, wherein said output swing improvement circuit comprises:

a NMOS, wherein the gate and the source of said NMOS are connected to said VDD power line and said VSS power line, respectively;

a first PMOS, wherein the source, the gate and the drain are connected to said VDD power line, the drain of said NMOS, and the source of said output PMOS, respectively; and a second PMOS, wherein the source, the gate and the drain are separately connected to the gate of said first PMOS, said VDD power line, and the source of said output PMOS, and then said second PMOS turning off and said NMOS turning on when said VDD voltage is high and thus said VDD voltage coupling to said output PMOS via said first PMOS instead of through said second diode so as to avoid voltage drop induced by said second diode.

11. An ESD protection circuit applied to an IC with power-down-mode operation, comprising:

an input pad;

an input PMOS, wherein the drain of said input PMOS is connected to said input pad;

an input NMOS, wherein the drain of said input NMOS is connected to said input pad; and an internal circuit connected to said input pad through at least one resistor;

an output PMOS, wherein the gate of said output PMOS is connected to said internal circuit;

an output NMOS, wherein the gate of said output NMOS is connected to said internal circuit;

an output pad connected with the drain of said PMOS and the drain of said NMOS;

a VDD power line connected and providing VDD voltage to said internal circuit;

a VSS power line connected and providing VSS voltage to said internal circuit and still connected to the source and the gate of said input NMOS and the source of said output NMOS;

an ESD bus line connected to the source and the gate of said input PMOS;

a first ESD clamp circuit connected between said VSS power line and said ESD bus line;

a second clamp circuit connected between said VDD power line and said VSS power line;

a first diode forward connected between said VDD power line and said ESD bus line to avoid leakage current induced from said input pad to said VDD power line which is grounded under power-down-mode operation, and still to avoid positive voltage at said input pad charging to said VDD power line via said input PMOS when said VDD power line is floating under power-down-mode operation;

a second diode forward connected between said VDD power line and the source of said output PMOS to avoid leakage current induced from said output pad to said VDD power line via said output PMOS when said VDD power line is grounded under power-down-mode operation, and still to avoid positive voltage at said output pad charging to said VDD power line through said output PMOS when said VDD power line is floating under power-down-mode operation; and a third diode, wherein the negative terminal of said third diode is connected to said ESD bus line and the coupled node connected to the positive terminal of said third diode is selected from said output pad and the source of said output PMOS.

12. The ESD protection circuit of claim 11 which can construct repeatedly to form a multi-stage ESD protection circuits, wherein the output pad of the previous stage of said ESD protection circuit is connected to the input pad of the next stage of said ESD protection circuit.

13. The ESD protection circuit of claim 11 further comprising at least one output swing improvement circuit connected between said VDD power line and the source of said output PMOS for compensating the voltage drop induced by said second diode.

* * * * *